(12) United States Patent
Katsui et al.

(10) Patent No.: US 9,070,600 B2
(45) Date of Patent: Jun. 30, 2015

(54) ACTIVE MATRIX SUBSTRATE, DISPLAY PANEL, AND DISPLAY DEVICE

(75) Inventors: Hiromitsu Katsui, Osaka (JP); Yoshimasa Chikama, Osaka (JP); Wataru Nakamura, Osaka (JP); Tetsunori Tanaka, Osaka (JP); Kenichi Kitoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/983,655

(22) PCT Filed: Jan. 31, 2012

(86) PCT No.: PCT/JP2012/052107
§ 371 (c)(1),
(2), (4) Date: Oct. 3, 2013

(87) PCT Pub. No.: WO2012/108301
PCT Pub. Date: Aug. 16, 2012

(65) Prior Publication Data
US 2014/0014952 A1    Jan. 16, 2014

(30) Foreign Application Priority Data

Feb. 7, 2011 (JP) .................................. 2011-024299

(51) Int. Cl.
| H01L 29/12 | (2006.01) |
| H01L 27/12 | (2006.01) |
| H01L 29/417 | (2006.01) |
| H01L 29/66 | (2006.01) |
| H01L 29/49 | (2006.01) |
| G02F 1/1368 | (2006.01) |

(52) U.S. Cl.
CPC ...... *H01L 27/1244* (2013.01); *H01L 29/41733* (2013.01); *H01L 29/4908* (2013.01); *H01L 29/66765* (2013.01); *G02F 1/1368* (2013.01)

(58) Field of Classification Search
USPC .................................................. 257/43, 59, 72
See application file for complete search history.

(56) References Cited

U.S. PATENT DOCUMENTS 5,539,219 A * 7/1996 den Boer et al. ................. 257/72
(Continued)

FOREIGN PATENT DOCUMENTS

| CN | 101335274 A | 12/2008 |
| JP | 01-091467 A | 4/1989 |

(Continued)

OTHER PUBLICATIONS

Official Communication issued in International Patent Application No. PCT/JP2012/052107, mailed on Mar. 27, 2012.

*Primary Examiner* — Matthew W Such
*Assistant Examiner* — Ali Naraghi
(74) *Attorney, Agent, or Firm* — Keating & Bennett, LLP

(57) ABSTRACT

A drain electrode (17) includes (i) a lower drain electrode (17a) stacked on a semiconductor layer (14) so as to partially cover an upper surface of the semiconductor layer (14) and (ii) an upper drain electrode (17b). The semiconductor layer (14), the lower drain electrode (17a), and the upper drain electrode (17b) form steps. In a step part where the steps are formed, a distance between a periphery of the lower drain electrode (17a) and a periphery of the upper drain electrode (17b) is more than 0.4 μm but less than 1.5 μm.

7 Claims, 13 Drawing Sheets

(56) References Cited

U.S. PATENT DOCUMENTS

| | | | |
|---|---|---|---|
| 7,863,120 B2* | 1/2011 | Chae | 438/167 |
| 2007/0072439 A1 | 3/2007 | Akimoto et al. | |
| 2008/0210942 A1 | 9/2008 | Yang | |
| 2011/0031497 A1* | 2/2011 | Yamazaki et al. | 257/59 |
| 2012/0138923 A1 | 6/2012 | Hara et al. | |

FOREIGN PATENT DOCUMENTS

| | | |
|---|---|---|
| JP | 2000-101091 A | 4/2000 |
| JP | 2002-341373 A | 11/2002 |
| JP | 2008-166789 A | 7/2008 |
| WO | 2010/150446 A1 | 12/2010 |

* cited by examiner

ACTIVE MATRIX SUBSTRATE, DISPLAY PANEL, AND DISPLAY DEVICE

TECHNICAL FIELD

The present invention relates to an active matrix substrate including thin film transistors, and a display panel and a display device each of which includes the active matrix substrate.

BACKGROUND ART

Recently, liquid crystal display devices have rapidly become popular because they consume less electric power and are more easily downsized than CRTs (Cathode-Ray-Tubes). Among the liquid crystal display devices, active matrix liquid crystal display devices, which respond at high speed and easily carry out multi-gradation display, have been in widespread use.

An active matrix liquid crystal display device includes (i) an active matrix substrate in which a plurality of pixels are arranged in a matrix manner, (ii) a counter substrate provided so as to face the active matrix substrate and (iii) a liquid crystal layer which is a display medium and sandwiched between the active matrix substrate and the counter substrate. In the active matrix substrate, a plurality of scanning lines and a plurality of signal lines are provided so as to intersect with each other, and pixel sections each including a thin film transistor (TFT) are provided in the vicinity of respective parts in which the plurality of scanning lines intersect with the plurality of signal lines.

Patent Literature 1 describes an array substrate for use in a liquid crystal display device, which array substrate includes (i) a first ohmic contact layer and a second ohmic contact layer which are provided on an active layer so as to separate from each other by a first distance, (ii) a first barrier pattern and a second barrier pattern which are provided on the first ohmic contact layer and the second ohmic contact layer, respectively, so as to separate from each other by the first distance so that the active layer is exposed between the first barrier pattern and the second barrier pattern and (iii) a source electrode and a drain electrode which are provided on the first barrier pattern and the second barrier pattern, respectively, so as to separate from each other by a second distance that is larger than the first distance, the source electrode being connected to a corresponding data line.

CITATION LIST

Patent Literature

Patent Literature 1
Japanese Patent Application Publication, Tokukai, No. 2008-166789 A (Publication Date: Jul. 17, 2008)

SUMMARY OF INVENTION

Technical Problem

The following description will discuss an example of a conventional active matrix substrate with reference to FIGS. 13 and 14. FIG. 14 is a cross-sectional view partially illustrating the conventional active matrix substrate. Specifically, FIG. 14 illustrates only part of a TFT 325 and its surrounding of a conventional active matrix substrate 300.

The conventional active matrix substrate 300 includes TFTs 325 in each of which a glass 311, a scanning line 312, an insulating layer 313, a semiconductor layer 314, a signal electrode 316, a drain electrode 317, a protective layer 318, an interlayer insulating layer 319, and a pixel electrode 320 are stacked as illustrated in FIG. 14. The semiconductor layer 314 is constituted by a channel layer 314a and an electrode contact layer 314b. The signal electrode 316 includes a lower signal electrode 316a and an upper signal electrode 316b. The drain electrode 317 includes a lower drain electrode 317a and an upper drain electrode 317b.

In each of the signal electrode 316 and the drain electrode 317 of the conventional active matrix substrate 300, the upper layer is stacked on the lower layer so as to cover all over an upper surface of the lower layer (see FIG. 14).

Note here that a material for the upper drain electrode 317b is possibly spread during production of the active matrix substrate 300. Specifically, the material is possibly spread, for example, by dry etching the drain electrode 317 or by forming the protective layer 318 by means of CVD. Such spread of the material onto the semiconductor layer 314 deteriorates the property of the TFT.

FIG. 13 is a view for explaining a method for producing the conventional active matrix substrate. FIG. 13 particularly illustrates a cross-sectional structure of the conventional active matrix substrate in which the drain electrode 317 is patterned. The upper drain electrode 317b is close to the semiconductor layer 314 in the conventional active matrix substrate 300. Therefore, the material for the upper drain electrode 317b, which is spread by, for example, dry etching, is highly likely to move onto the semiconductor layer 314 as indicated by an arrow of FIG. 13.

According to the conventional active matrix substrate 300, such movement of the material for the upper drain electrode 317b onto the semiconductor layer 314 causes a problem that the property of the TFT 325 is deteriorated. Patent Literature 1 does not describe how to solve the problem.

Patent Literature 1 describes that (i) the source electrode and the drain electrode are patterned by wet etching and (ii) barrier patterns are formed by dry etching so that the source electrode and the drain electrode are more etched (over-etched) than the barrier patterns. Patent Literature 1, however, does not describe at all how much the source electrode and the drain electrode are over-etched. In a case where the source electrode and the drain electrode are less over-etched, a material for the source electrode and a material for the drain electrode will spread onto the semiconductor layer. In contrast, in a case where the source electrode and the drain electrode are more over-etched, a resist will peel off or it will become difficult to form a thin wire.

Patent Literature 1 describes neither the problems nor how to solve the problems. It is therefore difficult to easily form TFTs having a stable property on the basis of a wiring structure built by a conventional technique.

The present invention was made in view of the problems of the conventional technique, and an object of the present invention is to provide an active matrix substrate having a wiring structure which allows TFTs having a stable property to be easily formed, and a display panel and a display device each of which includes the active matrix substrate.

Solution to Problem

In order to attain the object, an active matrix substrate in accordance with an embodiment of the present invention is configured to include thin film transistors each of which includes (i) a semiconductor layer and (ii) an electrode which is electrically connected to the semiconductor layer, the electrode including (i) a first metal layer stacked on the semiconductor layer so as to partially cover an upper surface of the semiconductor layer and (ii) a second metal layer stacked on the first metal layer, the semiconductor layer, the first metal layer, and the second metal layer forming steps, and in a step part in which the steps are formed, a distance between a periphery of the first metal layer and a periphery of the second metal layer being more than 0.4 μm but less than 1.5 μm.

According to the configuration, the first metal layer is provided, and the distance between the periphery of the first metal layer and the periphery of the second metal layer is more than 0.4 μm. It is therefore possible to sufficiently separate the semiconductor layer and the second metal layer from each other. This makes it possible to prevent a material for the second metal layer from being moved onto the semiconductor layer due to, for example, patterning of the electrode during production of the active matrix substrate.

As such, according to the configuration, it is possible to prevent a TFT property from deteriorating, and to keep the TFT property stable. It is also possible to employ any kind of metal as the material for the second metal layer without deteriorating the TFT property.

Further, according to the configuration, the distance between the periphery of the first metal layer and the periphery of the second metal layer is less than 1.5 μm. It is therefore possible to prevent a resist for use in pattering of the electrode from peeling off, and to easily form a wire even in a case where the wire is thin. As such, according to the present invention, it is possible to provide an active matrix substrate in which TFTs having a stable property can be easily formed.

For a fuller understanding of the nature and advantages of the invention, reference should be made to the ensuing detailed description taken in conjunction with the accompanying drawings.

Advantageous Effects of Invention

An active matrix substrate of the present invention includes thin film transistors each of which includes (i) a semiconductor layer and (ii) an electrode which is electrically connected to the semiconductor layer, the electrode including (i) a first metal layer stacked on the semiconductor layer so as to partially cover an upper surface of the semiconductor layer and (ii) a second metal layer stacked on the first metal layer, the semiconductor layer, the first metal layer, and the second metal layer forming steps, and in a step part in which the steps are formed, (i) an upper surface of the first metal layer having a first part which is not covered by the second metal layer, which first part is made by projecting the first metal layer farther than the second metal layer toward a second part of the upper surface of the semiconductor layer, which second part is not covered by the first metal layer and (ii) a distance between a periphery of the first metal layer and a periphery of the second metal layer being more than 0.4 μm but less than 1.5 μm. It is therefore possible to provide an active matrix substrate having a wiring structure which allows TFTs having a stable property to be easily formed.

Figure 4:
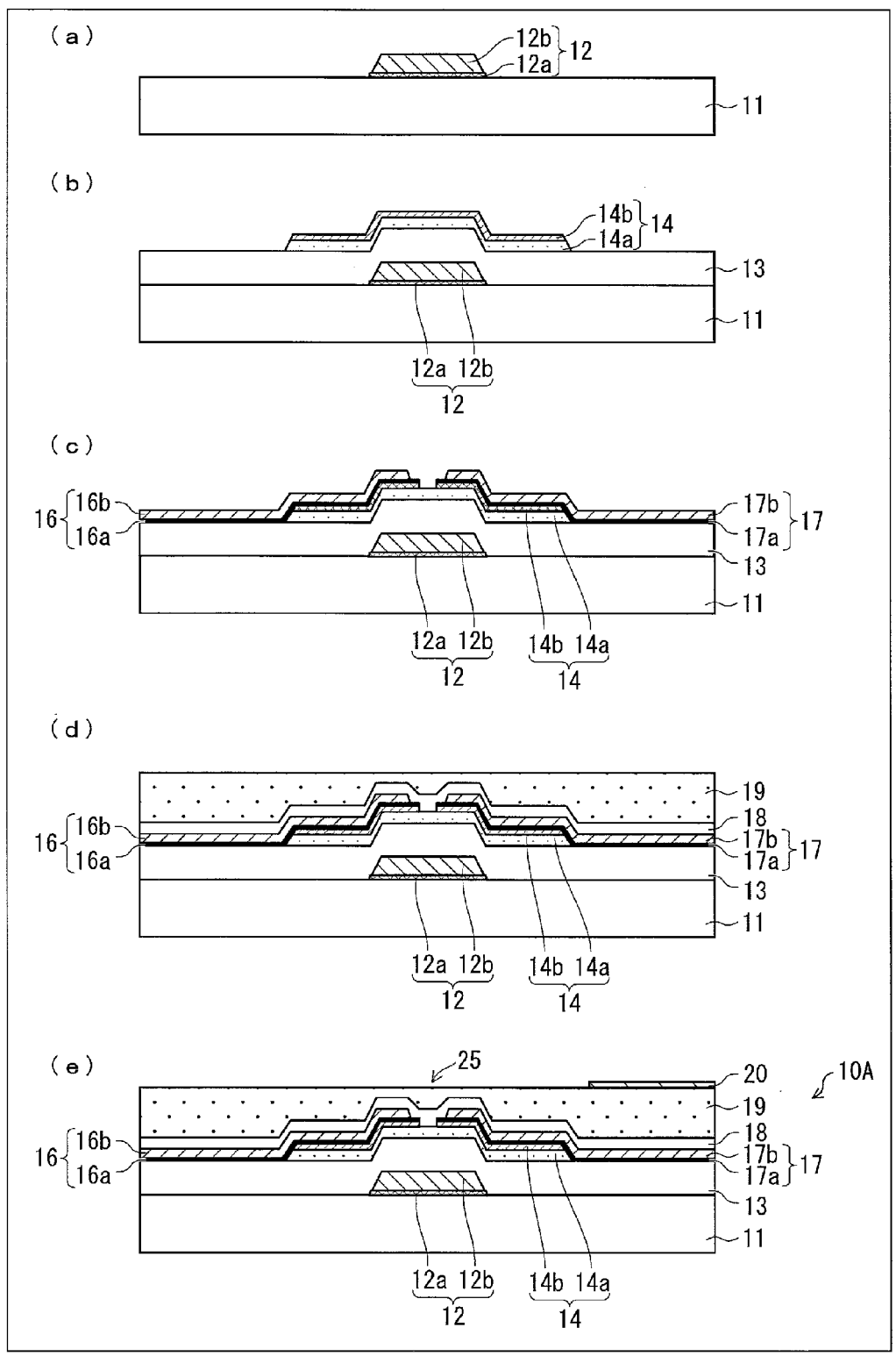

(a) through (e) of FIG. 4 are views for explaining a method for producing the active matrix substrate in accordance with the embodiment of the present invention.

Figure 5:
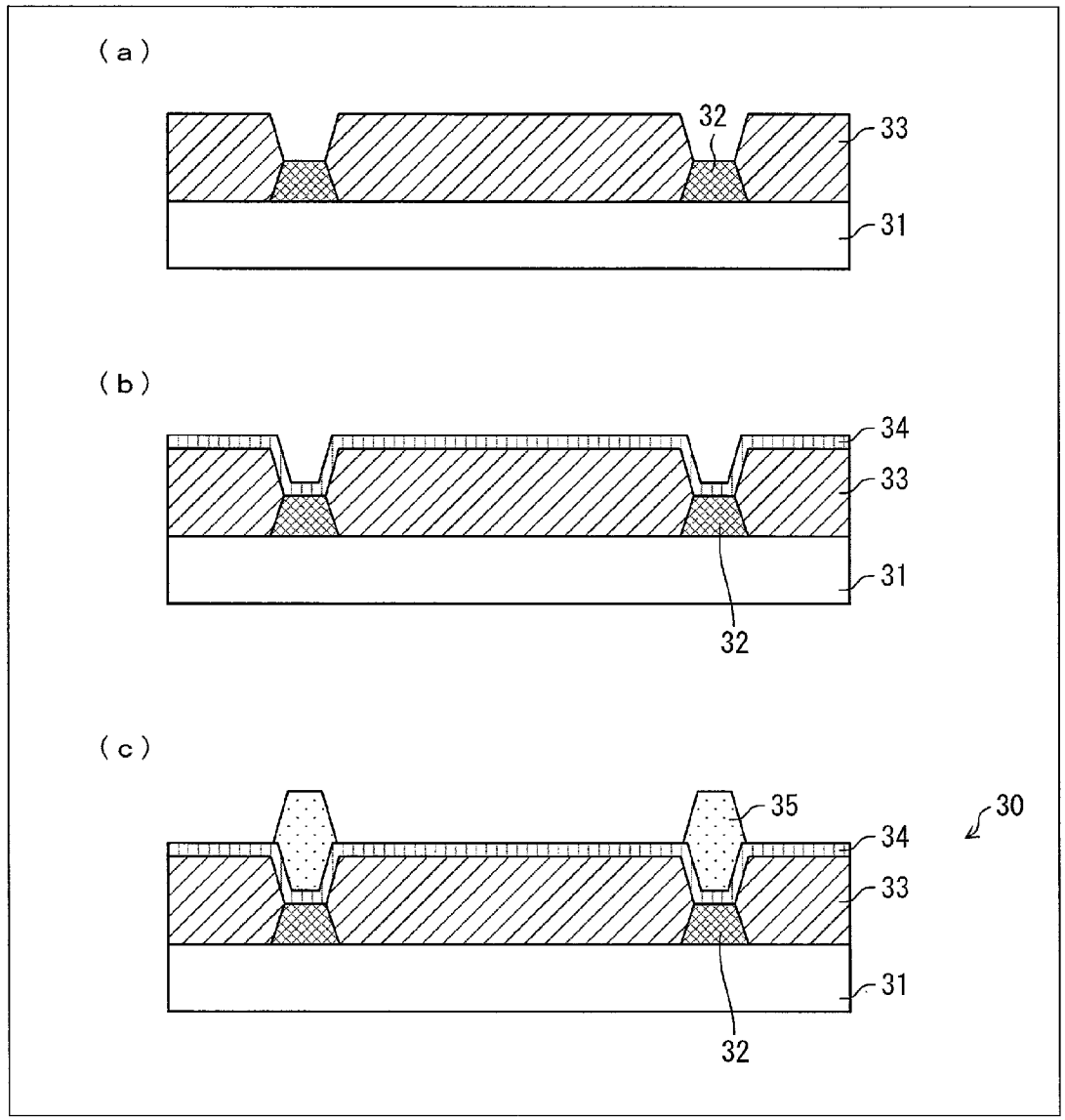

(a) through (c) of FIG. 5 are views for explaining a method for producing a counter substrate in accordance with the embodiment of the present invention.

Figure 6:
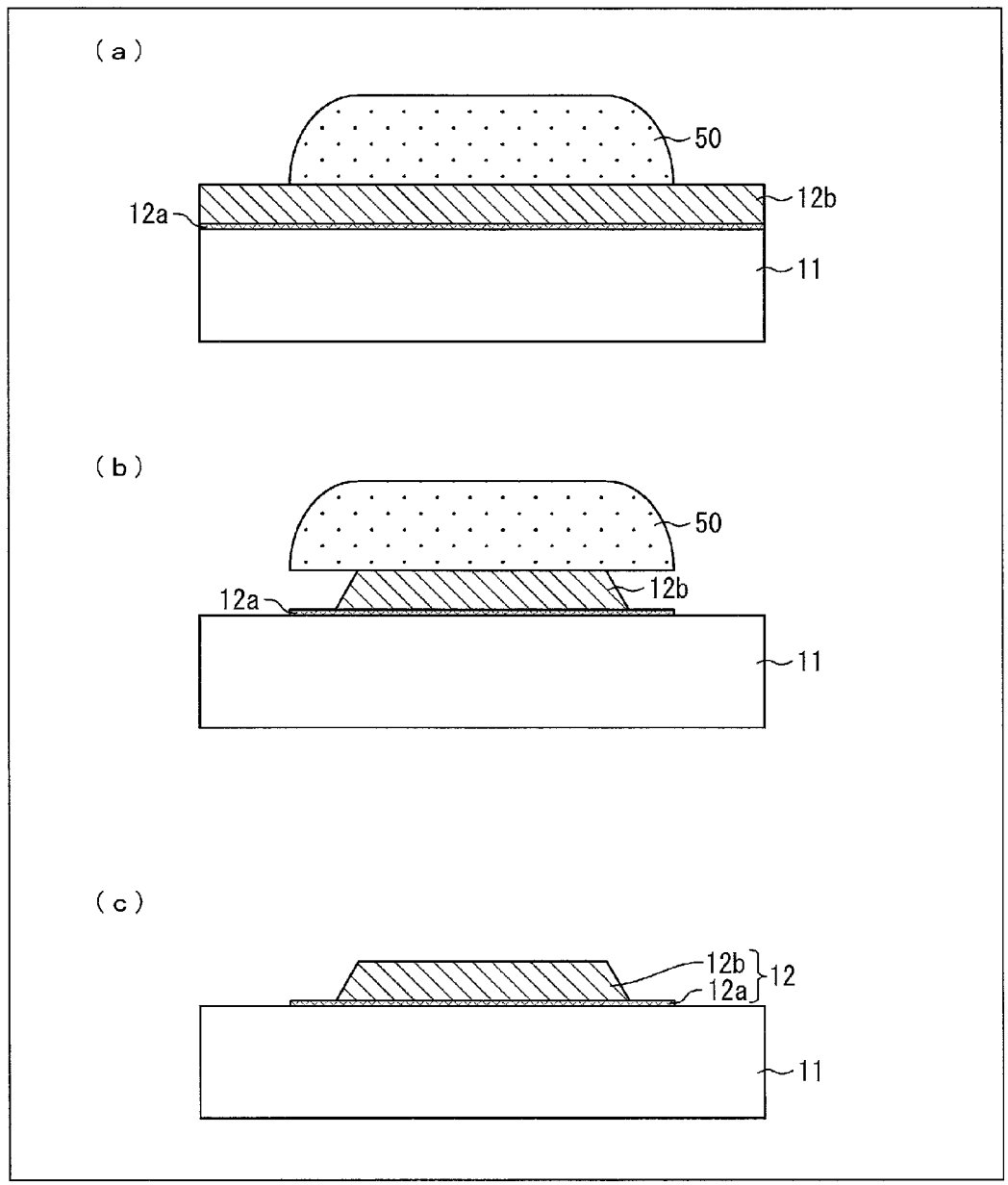

(a) through (c) of FIG. 6 are views for explaining a method for producing an active matrix substrate in accordance with another embodiment of the present invention.

Figure 7:
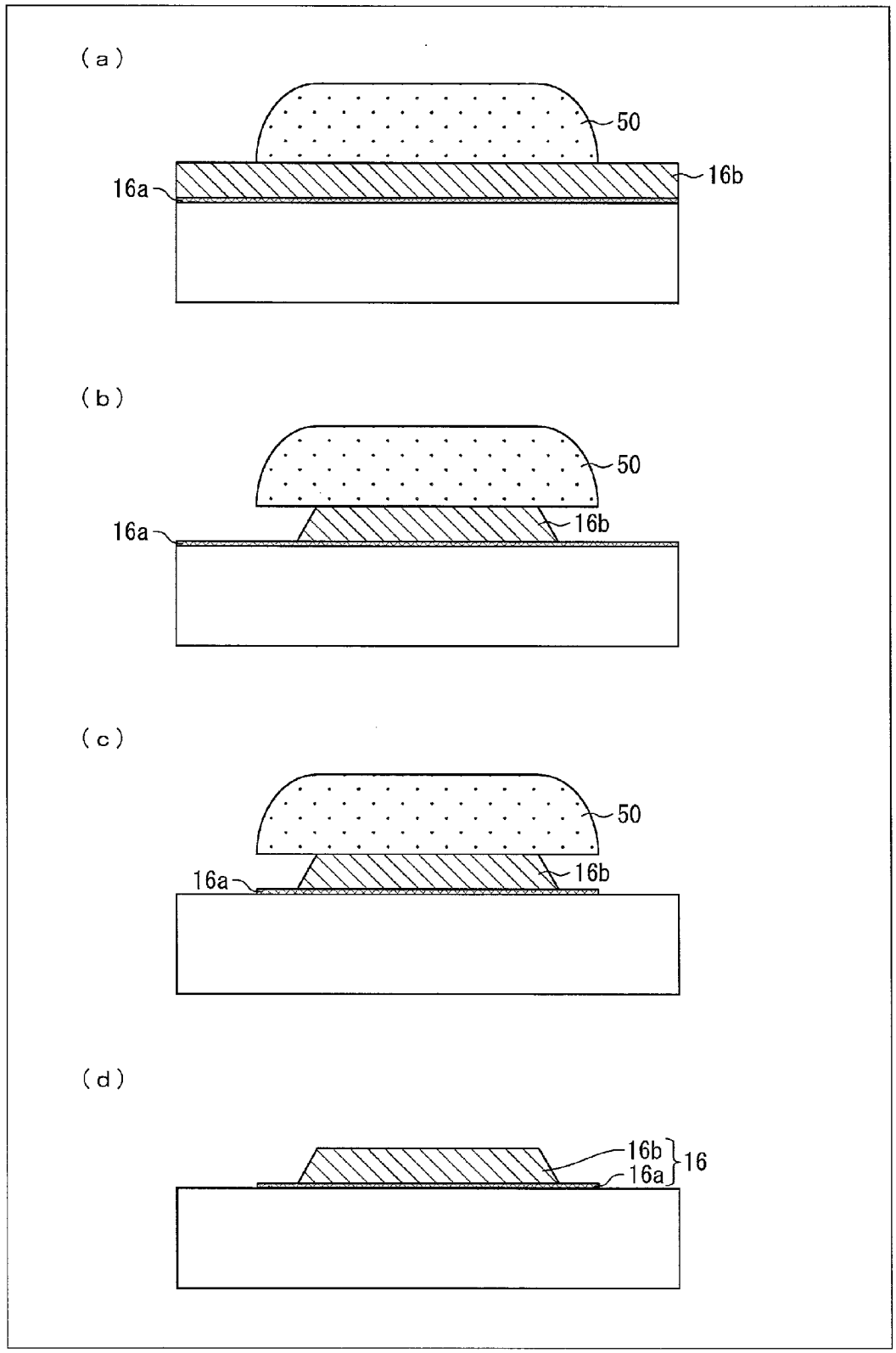

(a) through (d) of FIG. 7 are views for explaining the method for producing the active matrix substrate in accordance with the another embodiment of the present invention.

Figure 8:
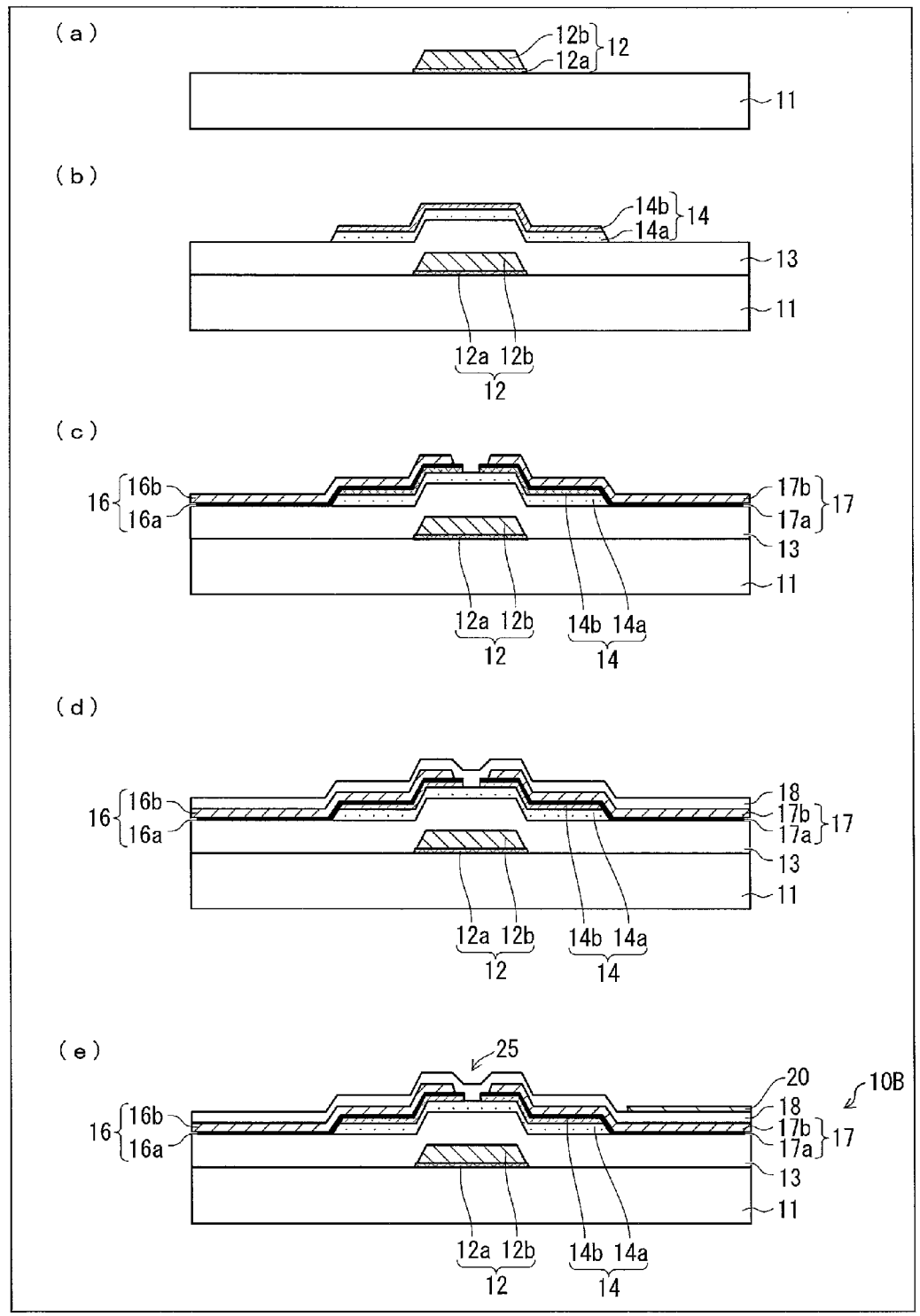

(a) through (e) of FIG. 8 are views for explaining a method for producing an active matrix substrate in accordance with another embodiment of the present invention.

Figure 9:
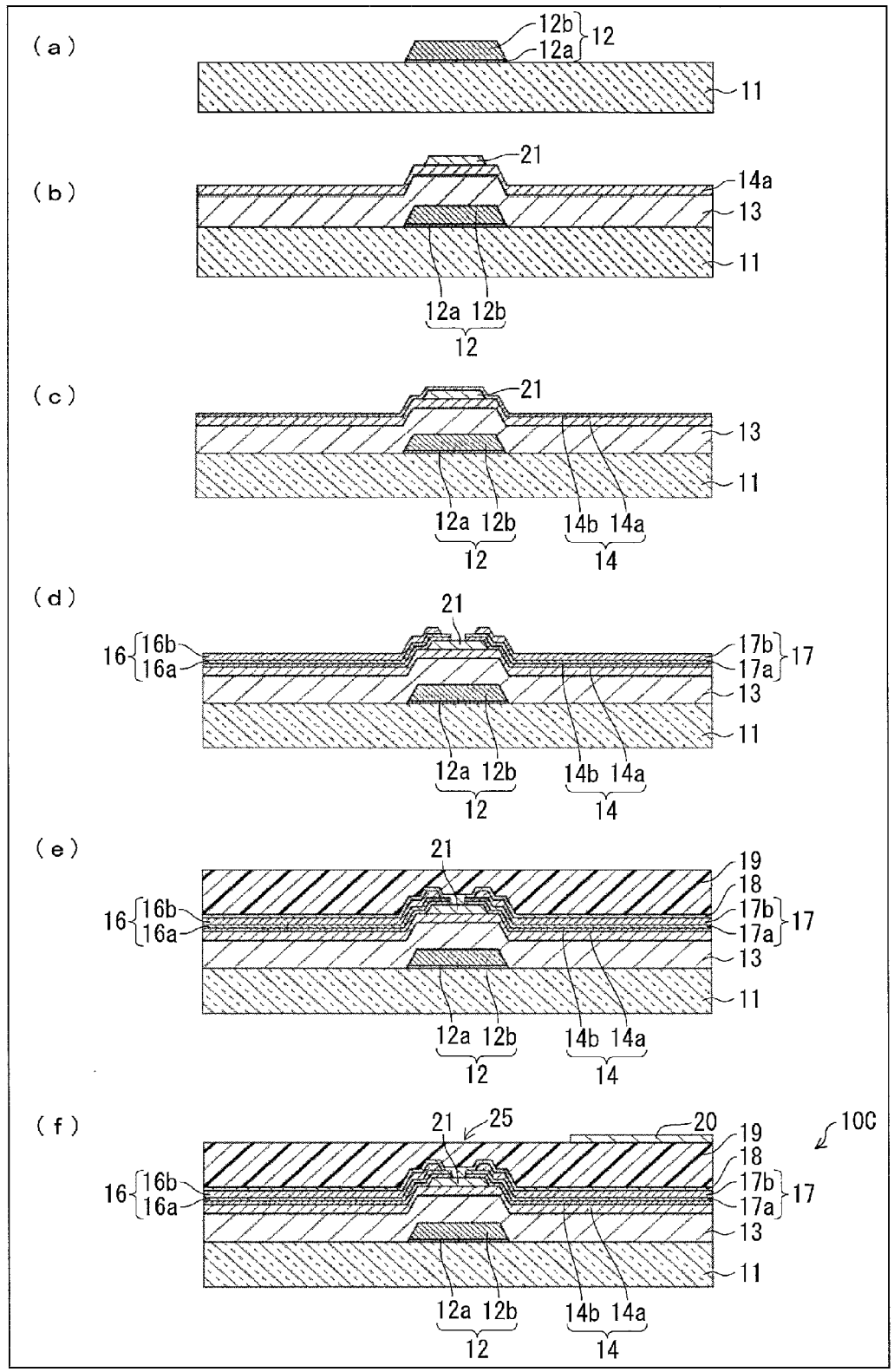

(a) through (f) of FIG. 9 are views for explaining a method for producing an active matrix substrate in accordance with another embodiment of the present invention.

Figure 10:
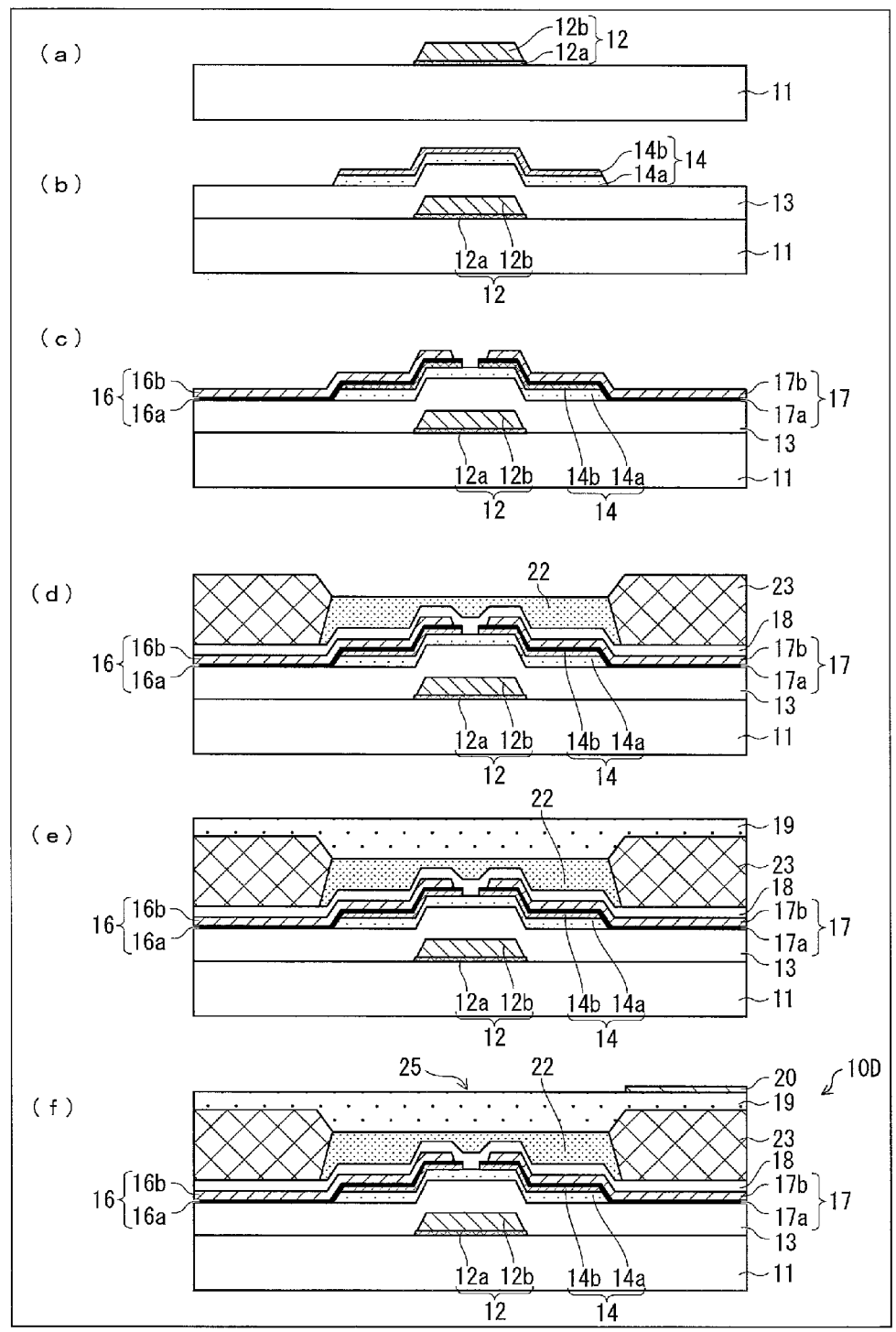

(a) through (f) of FIG. 10 are views for explaining a method for producing an active matrix substrate in accordance with another embodiment of the present invention.

Figure 11:
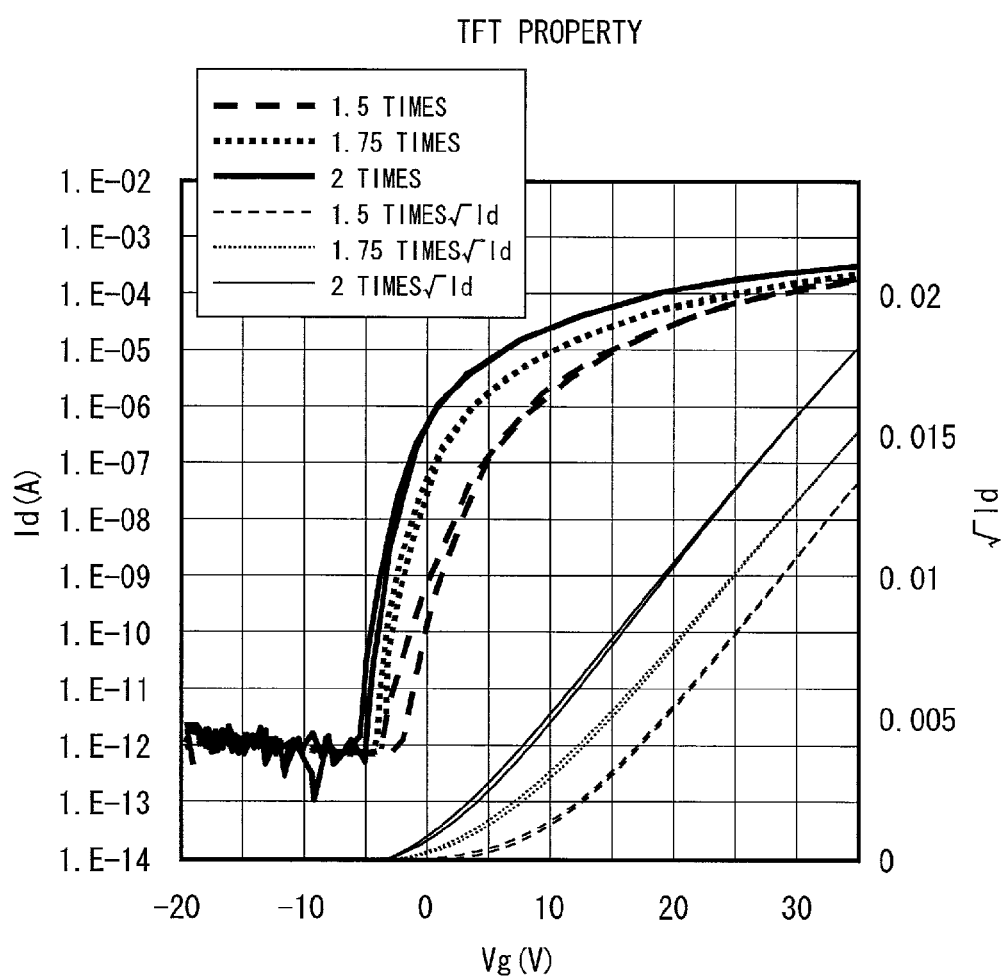

FIG. 11 is a graph illustrating the property of TFTs of each active matrix substrate in accordance with an example of the present invention.

Figure 12:
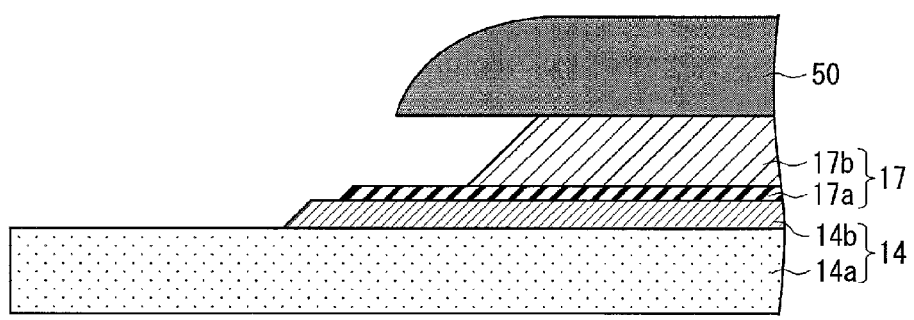

FIG. 12 is a view for explaining the method for producing the active matrix substrate in accordance with the embodiment of the present invention.

Figure 13:
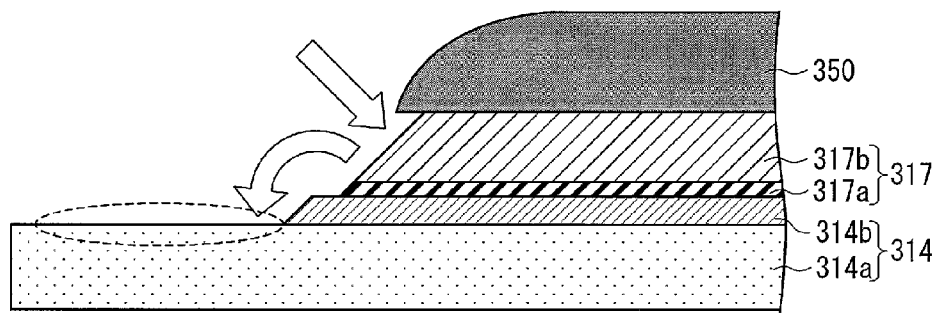

FIG. 13 is a view for explaining a method for producing a conventional active matrix substrate.

Figure 14:
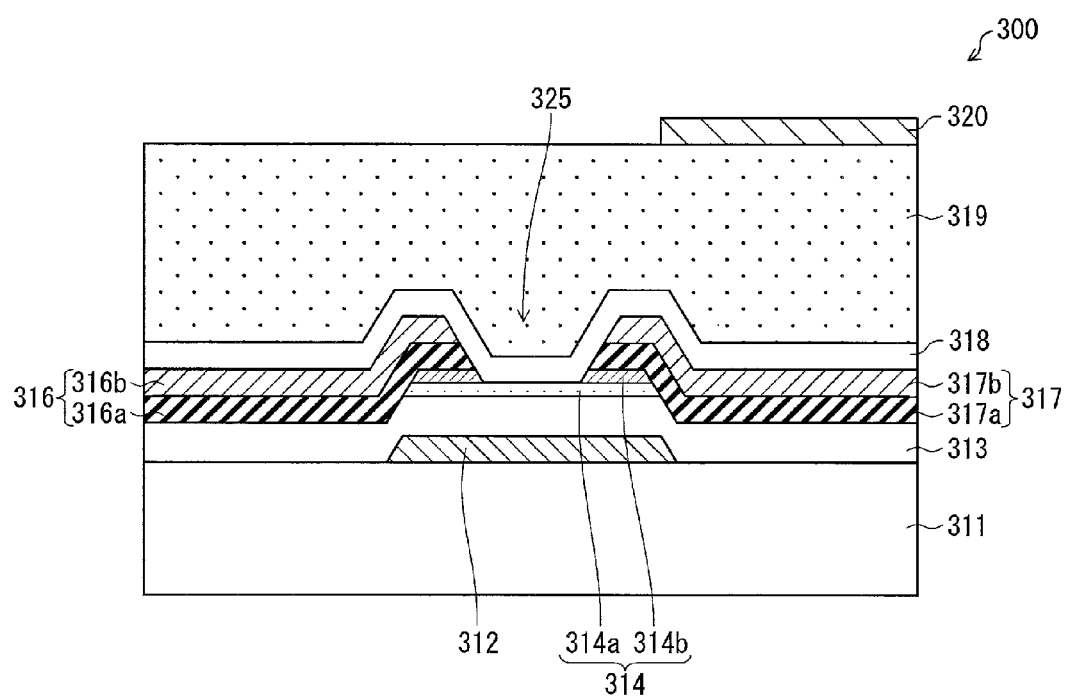

FIG. 14 is a cross-sectional view partially illustrating the conventional active matrix substrate.

Figure 15:
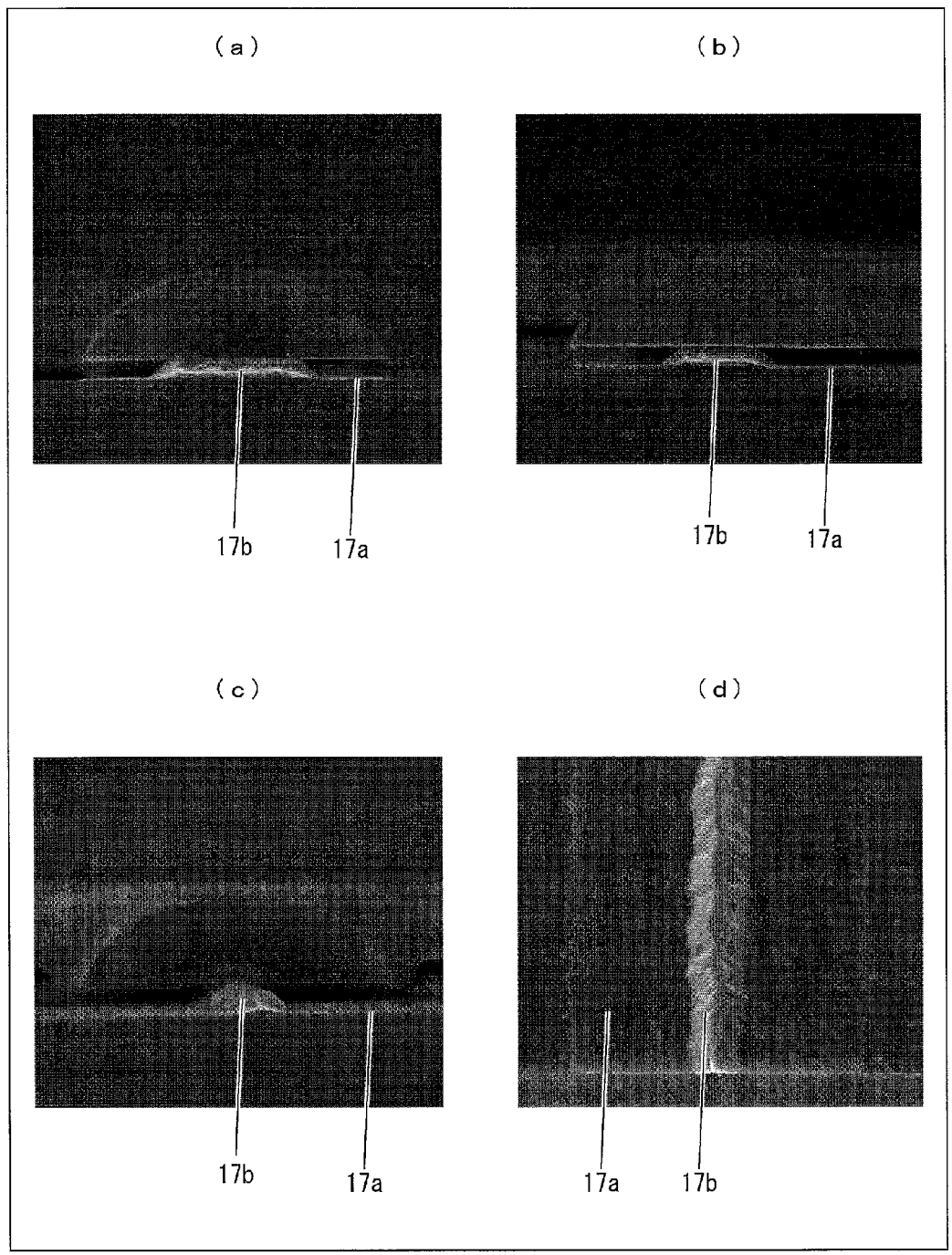

(a) through (d) of FIG. 15 illustrate electron microscopic images of active matrix substrates in each of which wet etching of a third step has been carried out.

DESCRIPTION OF EMBODIMENTS

Embodiment 1

The following description will discuss in detail Embodiment 1 of a liquid crystal display device of the present invention.

First, a configuration of a liquid crystal display device (display device) 1 of Embodiment 1 will be described.

(Configuration of Liquid Crystal Display Device 1)

The configuration of the liquid crystal display device 1 will be described with reference to FIGS. 1 through 3. First, an overall configuration of the liquid crystal display device 1 will be described with reference to FIG. 3. FIG. 3 is a view illustrating the liquid crystal display device in accordance with Embodiment 1 of the present invention.

The liquid crystal display device 1 includes an active matrix liquid crystal display panel (display panel) 2. The liquid crystal display panel 2 includes an active matrix substrate 10A, a counter substrate 30, and a liquid crystal layer (not illustrated) via which the active matrix substrate 10A is combined with the counter substrate 30 (see FIG. 3).

The active matrix substrate 10A includes pixel electrodes (not illustrated) arranged in a matrix manner, and has (i) a display region where an image to be viewed by a viewer is displayed and (ii) a non-display region which is provided outside of the display region and in which a viewer views no image. In the non-display region, (i) a scanning line terminal section 41 is provided so that external signals are supplied to a plurality of scanning lines 12 via the scanning line terminal section 41 and (ii) a signal line terminal section 42 is provided so that external signals are supplied to a plurality of signal lines via the signal line terminal section 42. The scanning line terminal section 41 is connected to the plurality of scanning lines 12 via respective terminal lines 43. The signal line terminal section 42 is connected to the plurality of signal lines directly via respective terminal lines 43.

In the active matrix substrate 10A, the plurality of scanning lines 12 intersect with the plurality of signal lines, and thin film transistors (hereinafter referred to as "TFTs") 25, each of which constitutes a pixel section, are provided in the vicinity of respective intersections of the plurality of scanning lines 12 and the plurality of signal lines. For each of the TFTs 25, a signal electrode (electrode) 16, a drain electrode (electrode) 17, and a pixel electrode 20 are provided. Note that a structure of a TFT 25 will be described later.

(Basic Structure of TFT 25)

A basic structure of a TFT 25 that is provided in the active matrix substrate 10A will be described below with reference to FIG. 1. FIG. 1 is a cross-sectional view partially illustrating the active matrix substrate in accordance with Embodiment 1 of the present invention. Note that FIG. 1 illustrates only part of the TFT 25 and its surrounding in the active matrix substrate 10A.

Figure 1:
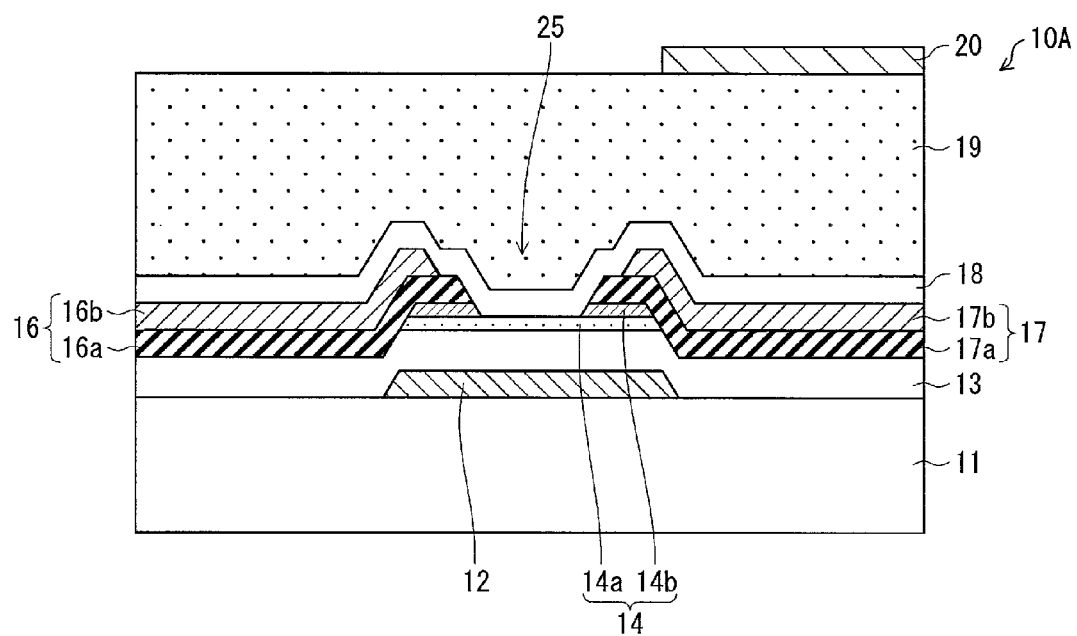
FIG. 1 is a cross-sectional view partially illustrating an active matrix substrate in accordance with an embodiment of the present invention.

The active matrix substrate 10A includes the TFTs 25 in each of which a glass 11, a scanning line 12, an insulating layer 13, a semiconductor layer 14, a signal electrode 16, a drain electrode 17, a protective layer 18, an interlayer insulating layer 19, and a pixel electrode 20 are stacked as illustrated in FIG. 1.

Each of the TFTs 25 has an inversely staggered (bottom gate) structure. That is, each of the TFTs 25 has a structure in which (i) the scanning line 12 is provided in a lowest layer, (ii) the insulating layer 13 and the semiconductor layer 14 are stacked on the scanning line and (iii) the signal electrode 16 and the drain electrode 17 are provided on the insulating layer 13 and the semiconductor layer 14.

The semiconductor layer 14 is constituted by a channel layer 14a and an electrode contact layer 14b. The semiconductor layer 14 is provided for electrically connecting the signal electrode 16 and the drain electrode 17 to each other.

The channel layer 14a can be made from a material such as amorphous silicon. Alternatively, the channel layer 14a can be made from an oxide semiconductor of, for example, (i) zinc oxide (ZnO) or (ii) an amorphous thin film having a composition of indium oxide, gallium oxide and zinc oxide (IGZO).

The electrode contact layer 14b can be a layer such as an N$^+$ contact layer which is doped with high concentration n-type impurities, and therefore can be made from a material such as N$^+$ amorphous silicon.

The signal electrode 16 is provided for a signal line. The signal electrode 16 includes a lower signal electrode (first metal layer) 16a and an upper signal electrode (second metal layer) 16b, and is electrically connected to the semiconductor layer 14.

The drain electrode 17 includes a lower drain electrode (first metal layer) 17a and an upper drain electrode (second metal layer) 17b, and is electrically connected to the signal electrode 16 via the semiconductor layer 14.

A material for the lower signal electrode 16a and the lower drain electrode 17a is not limited to a specific one. It is, however, preferable that the material is a metal which is unlikely to spread during production. Examples of the metal encompass titanium (Ti), tantalum (Ta), molybdenum (Mo), and alloys thereof. The lower signal electrode 16a and the lower drain electrode 17a, each of which is made of the metal, do not spread onto the semiconductor layer 14. It is therefore possible to form TFTs having a favorable property.

A material for the upper signal electrode 16b and the upper drain electrode 17b is not limited to a specific one. Examples of the material encompass copper (Cu), a copper alloy, and aluminum (Al). Among the examples, it is preferable that the material is particularly copper or the copper alloy because copper and the copper alloy have low resistances. This allows the signal electrode 16 and the drain electrode 17 to have low resistances.

An Example of the copper is pure copper. Examples of the copper alloy encompass an alloy of copper and magnesium (CuMg), an alloy of copper and manganese (CuMn), an alloy of copper and aluminum (CuAl), an alloy of copper and titanium (CuTi), an alloy of copper and zirconium (CuZr), and an alloy of copper and molybdenum (CuMo).

The scanning line 12 includes a lower scanning line 12a and an upper scanning line 12b which are not illustrated in FIG. 1. The lower scanning line 12a can be made from the material for the lower signal electrode 16a and the lower drain electrode 17a. The upper scanning line 12b can be made from a metallic material for the upper signal electrode 16b and the upper drain electrode 17b.

The insulating layer can be made from a material such as silicon nitride (SiNx) or silicon dioxide (SiO$_2$). Alternatively, the insulating layer 13 can be a double layer in which a layer of SiNx and a layer of SiO$_2$ are stacked. A gate insulating film 103 preferably has a thickness which falls within a range from 1000 Å to 5000 Å.

The protective layer 18 can be made from a material such as silicon nitride (SiNx) or silicon dioxide (SiO$_2$).

The interlayer insulating layer 19 is preferably made from a photosensitive material, and therefore can be made from a resin such as a photosensitive acrylic resin.

The pixel electrode 20 can be made from a transparent conductive material such as indium tin oxide (ITO) or indium zinc oxide (IZO).

The following description will discuss in further detail structures of the signal electrode 16 and the drain electrode 17 of each of the TFTs 25.

(Structures of Signal Electrode 16 and Drain Electrode 17)

The structures of the signal electrode 16 and the drain electrode 17 of each of the TFTs 25 will be described with reference to FIG. 2. FIG. 2 is a cross-sectional view illustrating a main part of the active matrix substrate in accordance with Embodiment 1 of the present invention. Note here that the structure of only the drain electrode 17 will be described below, and the signal electrode 16 is identical in structure to the drain electrode 17.

That is, in the following description, the drain electrode 17, the lower drain electrode 17a, and the upper drain electrode 17b can be read as the signal electrode 16, the lower signal electrode 16a, and the upper signal electrode 16b, respectively, as appropriate.

Figure 2:
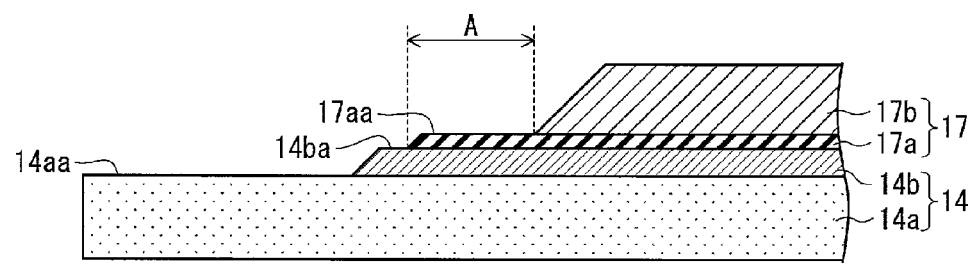
FIG. 2 is a cross-sectional view illustrating a main part of the active matrix substrate in accordance with the embodiment of the present invention.
Figure 3:
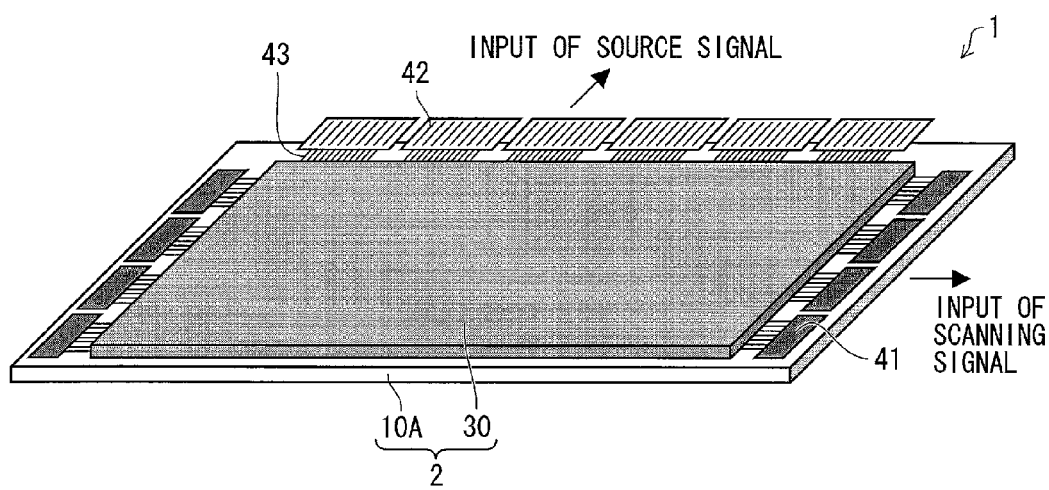
FIG. 3 is a view illustrating a liquid crystal display device in accordance with the embodiment of the present invention.

Each of the TFTs 25 is configured so that (i) the lower drain electrode 17a of the drain electrode 17 is stacked on the semiconductor layer 14 so as to partially cover an upper surface of the semiconductor layer 14, specifically, in FIG. 2, so as to partially cover an upper surface of the electrode contact layer 14b of the semiconductor layer 14, (ii) the upper drain electrode 17b is stacked on the lower drain electrode 17a and (iii) the channel layer 14a, the electrode contact layer 14b, the lower drain electrode 17a, and the upper drain electrode 17b are stacked so as to form steps.

In a step part where the steps are formed, the lower drain electrode 17a projects farther than the upper drain electrode 17b toward a part 14aa and a part 14ba of the upper surface of the semiconductor layer 14, which parts 14aa and 14ba are not covered by the lower drain electrode 17a, so that the lower drain electrode 17a has a part 17aa which is not covered by the upper drain electrode 17b.

Further, in the step part, a distance A between a periphery of the lower drain electrode 17a and a periphery of the upper drain electrode 17b is more than 0.4 μm but less than 1.5 μm.

Note here that (i) the "periphery of the lower drain electrode 17a" indicates a part where an upper surface of the lower drain electrode 17a or an end surface continuous with the upper surface of the lower drain electrode 17a is in contact with the upper surface of the semiconductor layer 14 and (ii) the "periphery of the upper drain electrode 17b" indicates a part where an upper surface of the upper drain electrode 17b or an end surface continuous with the upper surface of the upper drain electrode 17b is in contact with the upper surface of the lower drain electrode 17a.

According to Embodiment 1, since the lower drain electrode 17a is provided and the distance A is more than 0.4 μm, the semiconductor layer 14 and the upper drain electrode 17b can be sufficiently separated from each other. FIG. 12 is a view for explaining the method for producing the active matrix substrate in accordance with Embodiment 1 of the present invention. FIG. 12 particularly illustrates a cross-sectional structure of the active matrix substrate in which the drain electrode 17 has been patterned. As illustrated in FIG. 12, the upper drain electrode 17b and the semiconductor layer 14 are sufficiently separated from each other in the active matrix substrate 10A of Embodiment 1. It is therefore possible to prevent the material for the upper drain electrode 17b from being moved onto the semiconductor layer 14 due to patterning of the drain electrode 17.

As such, according to Embodiment 1, even in a case where the material for the upper drain electrode 17b is any kind of metal, it is possible to prevent the metal from moving onto the semiconductor layer 14 during production. This ultimately makes it possible to prevent a TFT property from deteriorating and to keep the TFT property stable. In other words, according to Embodiment 1, it is possible to employ any kind of metal as the material for the upper drain electrode 17b without deteriorating the TFT property.

According to Embodiment 1, since the distance A is less than 1.5 μm, it is possible to (i) prevent a resist from peeling off in a case where the resist is used to carry out patterning of the drain electrode 17 and (ii) easily form a wire even if the wire is thin. That is, according to a wiring structure of Embodiment 1, TFTs having a stable property can be easily formed.

Note that the lower drain electrode 17a can be stacked on the semiconductor layer 14 so as to completely cover the electrode contact layer 14b. In this case, (i) the lower drain electrode 17a and the electrode contact layer 14b are stacked so as to partially cover an upper surface of the channel layer 14a and (ii) the channel layer 14a, the lower drain electrode 17a, and the upper drain electrode 17b are stacked so as to form steps.

Alternatively, the electrode contact layer 14b can completely cover the channel layer 14a. In this case, (i) the lower drain electrode 17a is stacked on the semiconductor layer 14 so as to partially cover the upper surface of the electrode contact layer 14b and (ii) the electrode contact layer 14b, the lower drain electrode 17a, and the upper drain electrode 17b are stacked so as to form steps.

The active matrix substrate of Embodiment 1 is suitably applicable to a display panel of a display device.

The following description will discuss a method for producing the liquid crystal display device 1 of Embodiment 1.

First, a process of producing the active matrix substrate 10A of Embodiment 1 will be described below. Note that the process will be described in Embodiment 1 where (i) the lower scanning line 12a, the lower signal electrode 16a and the lower drain electrode 17a are made of Ti and (ii) the upper scanning line 12b, the upper signal electrode 16b, and the upper drain electrode 17b are made of Cu.

(Process of Producing Active Matrix Substrate 10A)

The active matrix substrate 10A of Embodiment 1 is produced through five photolithography steps.

The process of producing the active matrix substrate 10A of Embodiment 1 will be described in order of the following steps (1) through (5), with reference to (a) through (e) of FIG. 4. (a) through (e) of FIG. 4 are views for explaining the method for producing the active matrix substrate in accordance with Embodiment 1 of the present invention. Each of (a) through (e) of FIG. 4 illustrates a cross-sectional structure obtained in a case where a corresponding one of the steps (1) through (5) has been carried out. Specifically, each of (a) through (e) of FIG. 4 illustrates only part of a TFT 25 and its surrounding of the active matrix substrate 10A. Therefore, what will be described below is a process of producing the TFT 25 and its surrounding.

(1) First Step

In a first step, a scanning line 12 is formed as illustrated in (a) of FIG. 4. First, a film of Ti and a film of Cu are consecutively formed on a glass 11 by use of a sputtering method as a lower scanning line 12a and an upper scanning line 12b, respectively. Then, a pattern of a resist is formed by means of photolithography. Subsequently, the lower scanning line 12a and the upper scanning line 12b are patterned by use of a wet etching method (later described). Lastly, the resist is washed out so as to be removed.

In the first step, neither a thickness of the film of Ti nor a thickness of the film of Cu is limited to specific ones. It is, however, preferable that (i) the thickness of the film of Ti falls within a range from 30 nm to 150 nm and (ii) the thickness of the film of Cu falls within a range from 200 nm to 500 nm.

(2) Second Step

In a second step, an insulating layer 13, a channel layer 14a, and an electrode contact layer 14b are formed as illustrated in (b) of FIG. 4. First, a film of silicon nitride, a film of amorphous silicon, and a film of $n^+$ amorphous silicon are consecutively formed by means of CVD as the insulating layer 13, the channel layer 14a, and the electrode contact layer 14b, respectively. Then, a pattern of a resist is formed by means of photolithography. Subsequently, the channel layer 14a and the electrode contact layer 14b are patterned by means of dry etching. Lastly, the resist is washed out so as to be removed.

In the second step, thicknesses of the insulating layer 13, the channel layer 14a, and the electrode contact layer 14b are not limited to specific ones. It is, however, preferable that (i) the thickness of the insulating layer 13 made from silicon nitride falls within a range from 200 nm to 500 nm, (ii) the thickness of the channel layer 14a made from amorphous silicon falls within a range from 30 nm to 300 nm and (iii) the thickness of the electrode contact layer 14b made from $n^+$ amorphous silicon falls within a range from 50 nm to 150 nm.

(3) Third Step

In a third step, a signal electrode 16 and a drain electrode 17 are formed as illustrated in (c) of FIG. 4. Specifically, the signal electrode 16 and the drain electrode 18 are formed by carrying out patterning of a same film in a same layer.

First, (i) a film of Ti, which serves as a lower signal electrode 16a and a lower drain electrode 17a, and (ii) a film of Cu, which serves as an upper signal electrode 16b and an upper drain electrode 17b, are consecutively formed by use of a sputtering method. Then, a pattern of a resist is formed by means of photolithography. Subsequently, the lower signal electrode 16a, the upper signal electrode 16b, the lower drain electrode 17a, and the upper drain electrode 17b are formed by carrying out patterning by use of a wet etching method (later described). Further, the electrode contact layer 14b is partially removed by means of dry etching. Lastly, the resist is washed out so as to be removed.

In the third step, neither a thickness of the film of Ti nor a thickness of the film of Cu is limited to specific ones. It is, however, preferable that (i) the thickness of the film of Ti falls within a range from 30 nm to 150 nm and (ii) the thickness of the film of Cu falls within a range from 100 nm to 400 nm.

(4) Fourth Step

In a fourth step, a protective layer 18 and an interlayer insulating layer 19 are formed as illustrated in (d) of FIG. 4. First, a film of silicon nitride is formed as the protective layer 18 by means of CVD. Then, a film of a photosensitive interlayer insulating film material is formed as the interlayer insulating layer 19. Subsequently, the film of silicon nitride and the film of the photosensitive interlayer insulating film material are subjected to photolithography and dry etching so that the protective layer 18 and the interlayer insulating layer 19 are patterned.

In the fourth step, a thickness of the film of silicon nitride to be formed as the protective layer 18 is not limited to a specific one. It is, however, preferable that the thickness of the film of silicon nitride falls within a range from 100 nm to 700 nm.

(5) Fifth Step

In a fifth step, a pixel electrode 20 is formed as illustrated in (e) of FIG. 4. First, a film of a transparent conductive material such as indium tin oxide (ITO) or indium zinc oxide (IZO) is formed as the pixel electrode 20 by use of a sputtering method. Then, a pattern of a resist is formed by means of photolithography. Subsequently, the pixel electrode 20 is patterned by means of wet etching. Lastly, the resist is washed out so as to be removed.

In the fifth step, a thickness of the film of the transparent conductive material to be formed as the pixel electrode 20 is not limited to a specific one. It is, however, preferable that the thickness of the film of the transparent conductive material falls within a range from 50 nm to 200 nm.

The active matrix substrate 10A is thus produced through the first to fifth steps. Note, however, that the present invention is not necessarily limited to the above-described materials and layer thicknesses, but the active matrix substrate 10A can be made from conventionally and generally used materials for an active matrix substrate.

(Wet Etching Method)

Each of the scanning line 12, the signal electrode 16, and the drain electrode 17 in the TFT 25 of Embodiment 1 has a two-layer structure of a lower layer and an upper layer which are stacked so as to form steps (see (e) of FIG. 4).

According to Embodiment 1, the two-layer structures are built by carrying out the wet etching methods in the respective first and third steps in the following manner.

The wet etching method carried out in the first step of Embodiment 1 will be described with reference to (a) through (c) of FIG. 6. (a) through (c) of FIG. 6 are views for explaining the method for producing the active matrix substrate in accordance with Embodiment 1 of the present invention. (a) through (c) of FIG. 6 are cross-sectional views particularly illustrating respective steps which are carried out for patterning the scanning line 12.

The wet etching method in the first step is carried out through the following steps (1) through (3) so as to pattern the scanning line 12.

(1) Immediately before the wet etching method is carried out in the first step, (i) the film of Ti and the film of Cu are formed and stacked in this order on the glass 11 as the lower scanning line 12a and the upper scanning line 12b, respectively and then (ii) a resist 50 is formed by means of photolithography (see (a) of FIG. 6).

(2) The film of Ti and the film of Cu are simultaneously etched by the wet etching method with use of an etchant which contains hydrogen peroxide ($H_2O_2$) and a fluorine compound (see (b) of FIG. 6).

It is preferable in Embodiment 1 that the etchant contains (i) $H_2O_2$ whose concentration is not less than 5% but is less than 20% and (ii) a fluorine compound whose concentration is not less than 0.5% but is less than 3%. With use of the etchant, it is possible to etch the film of Cu faster than to etch the film of Ti. Such etching causes a shift amount (etching rate) of the film of Cu to be larger than that of the film of Ti. This allows the lower scanning line 12a and the upper scanning line 12b to be stacked to form steps (see (b) of FIG. 6).

Note that the etchant employed in Embodiment 1 is not limited to a specific one but preferably contains $H_2O_2$ and a fluorine compound. This is because in a case where the etchant contains $H_2O_2$ and a fluorine compound, (i) the shift amount of the film of Cu can be adjusted by changing the concentration of the $H_2O_2$ contained in the etchant and (ii) the shift amount of the film of Ti can be adjusted by changing the concentration of the fluorine compound contained in the etchant. It is therefore preferable that the concentration of the $H_2O_2$ contained in the etchant and the concentration of the fluorine compound contained in the etchant are adjusted as appropriate according to desired shift amounts of the film of Cu and the film of Ti.

(3) The resist 50 is washed out so as to be removed. This ultimately completes a pattern of the scanning line 12 (see (c) of FIG. 6).

The wet etching method in the third step is carried out through the above-described steps (1) through (3) so as to pattern the signal electrode 16 and the drain electrode 17. Note that it is preferable that an etchant used in the step (2) in the third step contains (i) $H_2O_2$ whose concentration is not less than 5% but is less than 20% and (ii) a fluorine compound whose concentration is not less than 0.5% but is less than 3%, and it is also preferable that an etching time is 1.3 to 3 times as long as a just etching time. Note that the "just etching time" means a time which is required for an upper layer (the film of Cu in the third step) of each of the signal electrode 16 and the drain electrode 17 to be etched to have a width equal to that of a resist 50.

The wet etching method in the third step allows each of the signal electrode 16 and the drain electrode 17 to have a distance A of more than 0.4 μm but less than 1.5 μm between a periphery of a lower layer and a periphery of the upper layer.

(Process of Producing Counter Substrate 30)

The following description will discuss a process of producing a counter substrate 30 of Embodiment 1, with reference to (a) through (c) of FIG. 5. (a) through (c) of FIG. 5 are views for explaining a method for producing the counter substrate in accordance with Embodiment 1 of the present invention. Each of (a) through (c) of FIG. 5 illustrates a cross-sectional structure obtained in a case where a corresponding step has been carried out.

The counter substrate 30 is produced through the following three photolithography steps (1) through (3).

(1) A black matrix 32, and a red, green or blue color filter 33 are formed on a glass 31 with use of photosensitive materials by means of photolithography (see (a) of FIG. 5).

(2) A pixel electrode 34 of 50 nm to 200 nm in thickness is formed by use of a sputtering method, and then patterned by means of photolithography and wet etching (see (b) of FIG. 5). This forms a common electrode.

(3) Photo spacers 35 are formed with use of a photosensitive material by means of photolithography (see (c) of FIG. 5).

(Combining Process)

The active matrix substrate 10A and the counter substrate 30 are combined with each other so that a liquid crystal layer is formed between the active matrix substrate 10A and the counter substrate 30. A combining process will be described in the following (1) through (3).

(1) First, an alignment film of polyimide is formed on each of the active matrix substrate 10A and the counter substrate 30 by use of a printing method.

(2) The active matrix substrate 10A and the counter substrate 30 are combined with each other after a sealing agent is printed and liquid crystal is dropped.

(3) The active matrix substrate 10A and the counter substrate 30 thus combined are diced.

Through the steps (1) through (3), the liquid crystal display device 1 of Embodiment 1 is produced in which the active matrix substrate 10A is combined with the counter substrate 30 via the liquid crystal layer.

Note that the active matrix substrate and the display panel in accordance with Embodiment 1 of the present invention are not limitedly applied to the above described liquid crystal display device but can be applied to display devices such as an organic EL display device, an inorganic EL display device, and an electrophoretic display device. It is therefore possible to easily produce a high quality display device by providing, in the display device, an active matrix substrate in which TFTs, which have a stable property, can be easily formed.

Embodiment 2

The following description will discuss Embodiment 2 of the liquid crystal display device of the present invention.

Embodiment 2 is identical to Embodiment 1 except for a process of producing an active matrix substrate 10A. Therefore, Embodiment 2 will describe only a difference from Embodiment 1. Identical reference numerals are given to members having respective configurations identical to those of Embodiment 1, and descriptions of the members are omitted in Embodiment 2.

In Embodiment 2, a signal electrode 16 and a drain electrode 17 are patterned by use of a wet etching method and a dry etching method in a step which corresponds to the third step of the process of producing the active matrix substrate 10A of Embodiment 1. Except for this, Embodiment 2 employs processes identical with those in Embodiment 1. The signal electrode 16, the drain electrode 17, and a scanning line 12 of Embodiment 2 are patterned by use of the following methods.

(Patterning of Scanning Line 12)

First, a wet etching method carried out in a first step of Embodiment 2 will be described with reference to (a) through (c) of FIG. 6. In the first step, the wet etching method is carried out through the following steps (1) through (3) so as to pattern the scanning line 12.

(1) Immediately before the wet etching method is carried out in the first step, (i) a film of Ti and a film of Cu are formed and stacked in this order on a glass 11 as a lower scanning line 12a and an upper scanning line 12b, respectively and then (ii) a resist 50 is formed by means of photolithography (see (a) of FIG. 6).

(2) The film of Ti and the film of Cu are simultaneously etched by the wet etching method with use of an etchant which contains hydrogen peroxide ($H_2O_2$) and a fluorine compound (see (b) of FIG. 6).

It is preferable in Embodiment 2 that the etchant contains (i) $H_2O_2$ whose concentration is not less than 5% but is less than 20% and (ii) a fluorine compound whose concentration is not less than 0.5% but is less than 3%. With use of the etchant, it is possible to etch the film of Cu faster than to etch the film of Ti. Such etching causes a shift amount (etching rate) of the film of Cu to be larger than that of the film of Ti. This allows the lower scanning line 12a and the upper scanning line 12b to be stacked to form steps (see (b) of FIG. 6).

Note that the etchant employed in Embodiment 2 is not limited to a specific one but preferably contains $H_2O_2$ and a fluorine compound. This is because in a case where the etchant contains $H_2O_2$ and a fluorine compound, (i) the shift amount of the film of Cu can be adjusted by changing the concentration of the $H_2O_2$ contained in the etchant and (ii) the shift amount of the film of Ti can be adjusted by changing the concentration of the fluorine compound contained in the etchant. It is therefore preferable that the concentration of the $H_2O_2$ contained in the etchant and the concentration of the fluorine compound contained in the etchant are adjusted as appropriate according to desired shift amounts of the film of Cu and the film of Ti.

(3) The resist 50 is washed out so as to be removed. This ultimately completes a pattern of the scanning line 12 (see (c) of FIG. 6).

(Patterning of Signal Electrode 16 and Drain Electrode 17)

Next, a wet etching method and a dry etching method, which are carried out in a third step of Embodiment 2, will be described with reference to (a) through (d) of FIG. 7. (a) through (d) of FIG. 7 are views for explaining a method for producing an active matrix substrate in accordance with Embodiment 2 of the present invention. (a) through (d) of FIG. 7 are cross-sectional views particularly illustrating respective steps which are carried out for patterning the signal electrode 16. Each of the signal electrode 16 and the drain electrode 17 is patterned through the steps.

In the third step, the wet etching method and the dry etching method are carried out through the following steps (4) through (7) so as to pattern the signal electrode 16 and the drain electrode 17.

(4) Immediately before the wet etching method and the dry etching method are carried out in the third step, (i) a film of Ti and a film of Cu are formed and stacked in this order on a base as a lower signal electrode 16a and an upper signal electrode 16b, respectively and then (ii) a resist 50 is formed by means of photolithography (see (a) of FIG. 7).

(5) The film of Cu is etched by the wet etching method with use of an etchant which contains hydrogen peroxide ($H_2O_2$) (see (b) of FIG. 7).

(6) The film of Ti is etched by use of the dry etching method so as to have a width equal to that of the resist 50 (see (c) of FIG. 7).

(7) The resist 50 is washed out so as to be removed. This ultimately completes a pattern of the signal electrode 16 (see (d) of FIG. 7).

According to Embodiment 2, (i) the film of Cu is etched so as to have a width smaller than that of the resist 50 because the resist 50 is not etched by the wet etching method and then (ii) the film of Ti is etched by the dry etching method so as to have the width equal to that of the resist 50. It is therefore possible to increase a difference in shift amount between the film of Cu and the film of Ti. Note that a wet etching time of Embodiment 2 is not limited to a specific one but is preferably adjusted as appropriate according to a desired difference in shift amount between the film of Cu and the film of Ti.

Embodiment 2 thus allows the lower signal electrode 16*a* and the upper signal electrode 16*b* to be stacked to form steps by causing the shift amount of the film of Cu to be larger than that of the film of Ti.

Note that, in the step (5) of the third step, it is preferable that (i) the etchant used in the wet etching method and (ii) the wet etching time are adjusted so that a distance A between a periphery of a lower layer and a periphery of an upper layer of each of the signal electrode 16 and the drain electrode 17 is more than 0.4 μm but less than 1.5 μm. For example, in a case where the upper layer is made of copper, the upper layer is preferably etched (i) with use of an etchant which contains $H_2O_2$ whose concentration is not less than 5% but is less than 10% and (ii) for a time that is twice to four times as long as the just etching time. This allows the distance A to be more than 0.4 μm but less than 1.5 μm.

Embodiment 3

The following description will discuss Embodiment 3 of the liquid crystal display device of the present invention.

Embodiment 3 is identical to Embodiments 1 and 2 except that no interlayer insulating layer 19 is provided in an active matrix substrate 10B of Embodiment 3. Therefore, Embodiment 3 will describe only a difference from Embodiments 1 and 2. Identical reference numerals are given to members having respective configurations identical to those of Embodiments 1 and 2, and descriptions of the members are omitted in Embodiment 3.

A process of producing the active matrix substrate 10B of Embodiment 3 will be described in order of the following steps (1) through (5), with reference to (a) through (e) of FIG. 8. (a) through (e) of FIG. 8 are views for explaining a method for producing the active matrix substrate in accordance with Embodiment 3 of the present invention. Each of (a) through (e) of FIG. 8 illustrates a cross-sectional structure obtained in a case where a corresponding one of the steps (1) through (5) has been carried out. Specifically, each of (a) through (e) of FIG. 8 illustrates only part of a TFT 25 and its surrounding of the active matrix substrate 10A. Therefore, what will be described below is a process of producing the TFT 25 and its surrounding.

(1) First Step

In a first step, a scanning line 12 is formed (see (a) of FIG. 8) in the same manner as the first step of Embodiment 1 or 2.

(2) Second Step

In a second step, an insulating layer 13, a channel layer 14*a*, and an electrode contact layer 14*b* are formed (see (b) of FIG. 8) in the same manner as the second step of Embodiment 1 or 2.

(3) Third Step

In a third step, a signal electrode 16 and a drain electrode 17 are formed (see (c) of FIG. 8) in the same manner as the third step of Embodiment 1 or 2.

(4) Fourth Step

In a fourth step, a protective layer 18 is formed (see (d) of FIG. 8). First, a film of silicon nitride is formed as the protective layer 18 by means of CVD. Then, a pattern of a resist is formed by means of photolithography. Subsequently, the protective layer 18 is patterned by means of dry etching. Lastly, the resist is washed out so as to be removed.

In the fourth step, a thickness of the film of silicon nitride to be formed as the protective layer 18 is not limited to a specific one but preferably falls within a range from 100 nm to 700 nm.

(5) Fifth Step

In a fifth step, a pixel electrode 20 is formed (see (e) of FIG. 8) in the same manner as the fifth step of Embodiment 1 or 2.

The active matrix substrate 10B is thus produced through the above-described first to fifth steps.

Embodiment 4

The following description will discuss Embodiment 4 of the liquid crystal display device of the present invention.

Embodiment 4 is identical to Embodiments 1 and 2 except that a channel protective layer 21 is provided in an active matrix substrate 10C of Embodiment 4. Therefore, Embodiment 4 will describe only a difference from Embodiments 1 and 2. Identical reference numerals are given to members having respective configurations identical to those of Embodiments 1 and 2, and descriptions of the members are omitted in Embodiment 4.

A process of producing the active matrix substrate 10C of Embodiment 4 will be described in order of the following steps (1) through (5), with reference to (a) through (f) of FIG. 9. (a) through (f) of FIG. 9 are views for explaining a method for producing the active matrix substrate in accordance with Embodiment 4 of the present invention. Each of (a) through (f) of FIG. 9 illustrates a cross-sectional structure obtained in a case where a corresponding one of the steps (1) through (5) has been carried out. Specifically, each of (a) through (f) of FIG. 9 illustrates only part of a TFT 25 and its surrounding of the active matrix substrate 10C. Therefore, what will be described below is a process of producing the TFT 25 and its surrounding.

(1) First Step

In a first step, a scanning line 12 is formed (see (a) of FIG. 9) in the same manner as the first step of Embodiment 1 or 2.

(2) Second Step

In a second step, an insulating layer 13, a channel layer 14*a*, and a channel protective layer 21 are formed (see (b) of FIG. 9). First, a film of silicon nitride, a film of amorphous silicon, and a film of silicon nitride are consecutively formed by means of CVD as the insulating layer 13, the channel layer 14*a*, and the channel protective layer 21, respectively. Then, a pattern of a resist is formed by means of photolithography. Subsequently, the channel protective layer 21 is patterned by means of dry etching. Lastly, the resist is washed out so as to be removed.

In the second step, thicknesses of the insulating layer 13, the channel layer 14*a* and the channel protective layer 21 are not limited to specific ones. It is, however, preferable that (i) the thickness of the insulating layer 13 made from silicon nitride falls within a range from 200 nm to 500 nm, (ii) the thickness of the channel layer 14*a* made from amorphous silicon falls within a range from 30 nm to 300 nm and (iii) the thickness of the channel protective layer 21 made from silicon nitride falls within a range from 100 nm to 300 nm.

(3) Third Step

In a third step, an electrode contact layer 14*b*, a signal electrode 16, and a drain electrode 17 are formed. The signal electrode 16 and the drain electrode 17 are formed by carrying out patterning of a same film in a same layer.

First, a film of $n^+$ amorphous silicon is formed as the electrode contact layer 14*b* by means of CVD (see (c) of FIG. 9). Then, (i) a film of Ti, which serves as a lower signal electrode 16*a* and a lower drain electrode 17*a*, and (ii) a film of Cu, which serves as an upper signal electrode 16b and an upper drain electrode 17b, are consecutively formed by use of a sputtering method (see (d) of FIG. 9). Then, a pattern of a resist is formed by means of photolithography. Subsequently, the lower signal electrode 16a, the upper signal electrode 16b, the lower drain electrode 17a, and the upper drain electrode 17b are formed by carrying out patterning by use of a method that is described in Embodiment 1 or 2. Further, the electrode contact layer 14b on the channel protective layer 21 is partially removed by means of dry etching. Lastly, the resist is washed out so as to be removed.

In the third step, thicknesses of the electrode contact layer 14b, the film of Ti and the film of Cu are not limited to specific ones. It is, however, preferable that (i) the thickness of the electrode contact layer 14b made from $n^+$ amorphous silicon falls within a range from 50 nm to 150 nm, (ii) the thickness of the film of Ti falls within a range from 30 nm to 150 nm and (iii) the thickness of the film of Cu falls within a range from 100 nm to 400 nm.

(4) Fourth Step

In a fourth step, a protective layer 18 and an interlayer insulating layer 19 are formed (see (e) of FIG. 9) in the same manner as the fourth step of Embodiment 1 or 2.

(5) Fifth Step

In a fifth step, a pixel electrode 20 is formed (see (f) of FIG. 9) in the same manner as the fifth step of Embodiment 1 or 2.

The active matrix substrate 10C is thus produced through the above-described first to fifth steps.

Embodiment 5

The following description will discuss Embodiment 5 of the liquid crystal display device of the present invention.

Embodiment 5 is identical to Embodiments 1 and 2 except that an active matrix substrate 10D of Embodiment 5 includes a black matrix 22 and a color filter 23 between a protective layer 18 and an interlayer insulating layer 19 but a counter substrate of Embodiment 5 includes no layer of a black matrix 32 and a color filter 33. Therefore, Embodiment 5 will describe only a difference from Embodiments 1 and 2. Identical reference numerals are given to members having respective configurations identical to those of Embodiments 1 and 2, and descriptions of the members are omitted in Embodiment 5.

A process of producing the active matrix substrate 10D of Embodiment 5 will be described in order of the following steps (1) through (6), with reference to (a) through (f) of FIG. 10. (a) through (f) of FIG. 10 are views for explaining a method for producing the active matrix substrate in accordance with Embodiment 5 of the present invention. Each of (a) through (f) of FIG. 10 illustrates a cross-sectional structure obtained in a case where a corresponding one of the steps (1) through (6) has been carried out. Specifically, each of (a) through (f) of FIG. 10 illustrates only part of a TFT 25 and its surrounding of the active matrix substrate 10D. Therefore, what will be described below is a process of producing the TFT 25 and its surrounding.

(1) First Step, (2) Second Step, and (3) Third Step of Embodiment 5 are exactly the same as those of Embodiment 1 or 2. Therefore, descriptions of the first through third steps of Embodiment 5 are omitted here. Each of (a) through (c) of FIG. 10 illustrates a cross-sectional structure obtained in a case where a corresponding one of the respective first through third steps has been carried out.

(4) Fourth Step

In a fourth step, a protective layer 18, a black matrix 22, and a color filter 23 are formed (see (d) of FIG. 10). First, a film of silicon nitride is formed as the protective layer 18 by means of CVD. Then, the black matrix 22, and a red, green or blue color filter 23 are formed with use of photosensitive materials by means of photolithography.

In the fourth step, a thickness of the film of silicon nitride to be formed as the protective layer 18 is not limited to a specific one but preferably falls within a range from 100 nm to 700 nm.

(5) Fifth Step

In a fifth step, an interlayer insulating layer 19 is formed (see (e) of FIG. 10). Specifically, a film of a photosensitive interlayer insulating film material is formed as the interlayer insulating layer 19, and then subjected to photolithography and dry etching so that the interlayer insulating layer 19 is patterned.

(6) Sixth Step

In a sixth step, a pixel electrode 20 is formed (see (f) of FIG. 10). First, a film of a transparent conductive material such as ITO (or IZO) is formed as the pixel electrode 20 by use of a sputtering method. Then, a pattern of a resist is formed by means of photolithography. Subsequently, the pixel electrode 20 is patterned by means of wet etching. Lastly, the resist is washed out so as to be removed.

In the sixth step, a thickness of the film of the transparent conductive material to be formed as the pixel electrode 20 is not limited to a specific one but preferably falls within a range from 50 nm to 200 nm.

The active matrix substrate 10D is thus produced through the above-described first to sixth steps.

According to Embodiment 5, since the active matrix substrate 10D includes the black matrix 22 and the color filter 23, the counter substrate does not need to include any layer of a black matrix and a color filter. Therefore, the counter substrate of Embodiment 5 includes neither a black matrix nor a color filter (not illustrated).

The present invention is not limited to the description of the embodiments above, and can therefore be modified by a skilled person in the art within the scope of the claims. Namely, an embodiment derived from a proper combination of technical means disclosed in different embodiments is encompassed in the technical scope of the present invention.

EXAMPLES

Example 1

Active matrix substrates, each of which included TFTs which were identical in structure to the TFT illustrated in FIG. 1, were prepared, and the property of the TFTs was measured. Note that the active matrix substrates were prepared by use of the method described in Embodiment 2. That is, in a third step of Example 1, patterning of a signal electrode 16 and a drain electrode 17 was carried out by use of a wet etching method and a dry etching method.

In the third step, the wet etching method was carried out under different first through third conditions so that respective first through third active matrix substrates were prepared. Under the different first through third conditions, the wet etching method was carried out for respective wet etching times of 1.5 times, 1.75 times and twice as long as a just etching time with use of an etchant having an appropriate $H_2O_2$ concentration. In a case where the wet etching time was 1.5 times as long as the just etching time, a distance A was 0.2 µm between a periphery of a lower layer and a periphery of an upper layer of each of the signal electrode 16 and the drain electrode 17 of each TFT in the first active matrix substrate. In a case where the wet etching time was 1.75 times as long as the just etching time, a distance A was 0.3 µm between a periphery of a lower layer and a periphery of an upper layer of each of the signal electrode 16 and the drain electrode 17 of each TFT in the second active matrix substrate. In a case where the wet etching time was twice as long as the just etching time, each of the signal electrode 16 and the drain electrode 17a distance A was 0.45 µm between a periphery of a lower layer and a periphery of an upper layer of each of the signal electrode 16 and the drain electrode 17 of each TFT in the third active matrix substrate.

The property of the TFTs in each of the first through third active matrix substrates was analyzed by use of a manual prober and a semiconductor parameter analyzer (that is manufactured by Agilent Technologies).

FIG. 11 illustrates the result of the analysis. FIG. 11 is a graph illustrating the property of the TFTs in each of the first through third active matrix substrates in accordance with Example 1 of the present invention. As is clear from FIG. 11, the property of the TFTs, in each of which the distance A was not more than 0.5 µm, that is, the distance A was 0.2 µm or 0.3 µm, remarkably shifted toward a positive side. On the other hand, the TFTs in each of which the distance A was 0.45 µm had a favorable property.

Example 2

Active matrix substrates, each of which includes TFTs which are identical in structure to the TFT illustrated in FIG. 1, were prepared, and conditions, under which the respective active matrix substrates were prepared, were evaluated. Note that the active matrix substrates were prepared by use of a method described in Embodiment 1. That is, in a third step of Example 2, patterning of a signal electrode 16 and a drain electrode 17 was carried out only by use of a wet etching method.

In the third step, the wet etching method was carried out under different first through third conditions so that respective first through third active matrix substrates were prepared.

Under different first through third conditions, the wet etching method was carried out with use of respective first through third etchants having different $H_2O_2$ concentrations. In a case where the first etchant was used, a distance A was 1.0 µm between a periphery of a lower layer and a periphery of an upper layer of each of the signal electrode 16 and the drain electrode 17 of each TFT in the first active matrix substrate. In a case where the second etchant was used, a distance A was 1.3 µm between a periphery of a lower layer and a periphery of an upper layer of each of the signal electrode 16 and the drain electrode 17 of each TFT in the second active matrix substrate. In a case where the third etchant was used, a distance A was 1.6 µm between a periphery of a lower layer and a periphery of an upper layer of each of the signal electrode 16 and the drain electrode 17 of each TFT in the third active matrix substrate.

A cross-sectional shape of the drain electrode 17 and a resist 50 (photoresist) in each of the first through third active matrix substrates where wet etching of the third step has been carried out was observed through an electronic microscope. (a) through (c) of FIG. 15 illustrate the result of the observation.

(a) through (d) of FIG. 15 illustrate electron microscopic images of the first through third active matrix substrates in each of which wet etching of the third step has been carried out. Specifically, (a) of FIG. 15 illustrates a cross section of the first active matrix substrate in which the distance A is 1.0 µm, (b) of FIG. 15 illustrates a cross section of the second active matrix substrate in which the distance A is 1.3 µm, and (c) of FIG. 15 illustrates a cross section of the third active matrix substrate in which the distance A is 1.6 µm. (d) of FIG. 15 is a top view illustrating the third active matrix substrate (which is illustrated in (c) of FIG. 15) from which the resist 50 has been removed.

The resist 50 was stably left in both (i) the first active matrix substrate in which the distance A was 1.0 µm (see (a) of FIG. 15) and (ii) the second active matrix substrate in which the distance A was 1.3 µm (see (b) of FIG. 15). Therefore, the first and second active matrix substrates were capable of being subjected to dry etching immediately after the wet etching.

In the third active matrix substrate (see (c) and (d) of FIG. 15) in which the distance A was 1.6 µm, however, the resist 50 was peeled off in a narrow part of the drain electrode 17. Therefore, the third active matrix substrate was not capable of being subjected to dry etching immediately after the wet etching.

Example 2 demonstrated that in a case where the distance A was 1.0 µm or 1.3 µm, it was possible to prevent the resist 50 for use in pattering of the drain electrode 17 from peeling off. That is, Example 2 strongly suggested that in a case where the distance A is less than 1.5 µm, it is possible to (i) prevent a resist from peeling off and (ii) easily form a wire even in a case where the wire is thin.

It is preferable to configure the active matrix substrate in accordance with an embodiment of the present invention such that the second metal layer contains copper or a copper alloy.

According to the configuration, it is possible to reduce the resistance of the electrode because the copper and the copper alloy are low in resistance. Further, according to the configuration, it is possible to prevent the copper or the copper alloy from moving onto the semiconductor layer during production of the active matrix substrate. This makes it possible to prevent a TFT property from deteriorating and to keep the TFT property stable.

It is preferable to configure the active matrix substrate in accordance with an embodiment of the present invention such that the first metal layer contains at least one selected from the group consisting of titanium, tantalum, molybdenum, and alloys thereof.

According to the configuration, the first metal layer does not move onto the semiconductor layer during production of the active matrix substrate because titanium, tantalum, molybdenum, and alloys thereof are unlikely to spread due to, for example, dry etching. It is therefore possible to prevent the TFT property from deteriorating and to keep it stable.

It is preferable to configure the active matrix substrate in accordance with an embodiment of the present invention such that the electrode is a signal electrode or a drain electrode.

According to the configuration, it is possible to employ any kind of metal as a material for the second metal layer of the signal electrode or the drain electrode without deteriorating the TFT property. Further, according to the configuration, it is possible to (i) prevent a resist for use in pattering of the signal electrode or the drain electrode from peeling off and (ii) easily form the signal electrode or the drain electrode even in a case where the signal electrode or the drain electrode is thin.

It is preferable to configure the active matrix substrate in accordance with an embodiment of the present invention such that each of the thin film transistors includes two electrodes each of which is the electrode, and the two electrodes are arranged so that the step part of one of the two electrodes faces the step part of the other of the two electrodes via a part of the upper surface of the semiconductor layer, which part is not covered by the first metal layers of the respective two electrodes.

According to the configuration, it is possible to provide TFTs having a stable property.

It is preferable to configure the active matrix substrate in accordance with an embodiment of the present invention such that the one of the two electrodes is a signal electrode, and the other of the two electrodes is a drain electrode.

According to the configuration, it is possible to employ any kind of metal as each material for the second metal layers of the signal electrode and the drain electrode without deteriorating the TFT property. Further, according to the configuration, it is possible to (i) prevent a resist for use in patterning of the signal electrode and the drain electrode from peeling off and (ii) easily form the signal electrode and the drain electrode even in a case where the signal electrode and the drain electrode are thin.

In order to attain the object, a display panel in accordance with an embodiment of the present invention is configured to include any one of the above-described active matrix substrates. A display device in accordance with an embodiment of the present invention is configured to include the display panel.

According to the configurations, it is possible to provide a display panel and a display device each of which includes an active matrix substrate in which TFTs having a stable property can be easily formed.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

According to the present invention, TFTs having a stable property can be easily formed. Therefore, the present invention is suitably applicable to a case where a high quality active matrix substrate and a liquid crystal display device are produced.

REFERENCE SIGNS LIST

1: liquid crystal display device (display device)
2: liquid crystal display panel (display panel)
10A: active matrix substrate
14: semiconductor layer
16: signal electrode (electrode)
16a: lower signal electrode (first metal layer)
16b: upper signal electrode (second metal layer)
17: drain electrode (electrode)
17a: lower drain electrode (first metal layer)
17b: upper drain electrode (second metal layer)
25: TFT (thin film transistor)

The invention claimed is:

1. An active matrix substrate, comprising:
   thin film transistors each of which includes (i) a semiconductor layer including a channel layer and (ii) a signal electrode and a drain electrode, each of which is electrically connected to the semiconductor layer, wherein
   the signal electrode includes (i) a first signal metal layer stacked directly on the semiconductor layer so as to partially cover an upper surface of the semiconductor layer and (ii) a second signal metal layer stacked directly on the first signal metal layer so as to partially cover an upper surface of the first signal metal layer, wherein
   at the upper surface of the semiconductor layer, the first signal metal layer includes a first signal metal layer extended portion extending laterally toward a central portion of the channel layer, the first signal metal layer extended portion is exposed from the second signal metal layer and has a length between 0.4 μm and 1.5 μm, and
   the drain electrode includes (i) a first drain metal layer stacked directly on the semiconductor layer so as to partially cover an upper surface of the semiconductor layer and (ii) a second drain metal layer stacked directly on the first drain metal layer so as to partially cover an upper surface of the first drain metal layer, wherein
   at the upper surface of the semiconductor layer, the first drain metal layer includes a first drain metal layer extended portion extending laterally towards the central portion of the channel layer, the first drain metal layer extended portion is exposed from the second drain metal layer and has a length between 0.4 μm and 1.5 μm.

2. The active matrix substrate as set forth in claim 1, wherein the second signal metal layer and the second drain metal layer include copper or a copper alloy.

3. The active matrix substrate as set forth in claim 1, wherein the first signal metal layer and the first drain metal layer include at least one selected from the group consisting of titanium, tantalum, molybdenum, and alloys thereof.

4. A display panel, comprising an active matrix substrate recited in claim 1.

5. A display device, comprising a display panel recited in claim 4.

6. The active matrix substrate as set forth in claim 1, wherein the semiconductor layer is made from an oxide semiconductor.

7. The active matrix substrate as set forth in claim 6, wherein the oxide semiconductor has a composition of indium oxide, gallium oxide and zinc oxide.

* * * * *